(12) United States Patent
Wang

(10) Patent No.: US 11,114,426 B2
(45) Date of Patent: Sep. 7, 2021

(54) BENDABLE PANEL AND METHOD OF FABRICATING SAME

(71) Applicant: WUHAN CHINA STAR OPTOELECTRONICS SEMICONDUCTOR DISPLAY TECHNOLOGY CO., LTD., Wuhan (CN)

(72) Inventor: Mingliang Wang, Wuhan (CN)

(*) Notice: Subject to any disclaimer, the term of this patent is extended or adjusted under 35 U.S.C. 154(b) by 274 days.

(21) Appl. No.: 16/349,283

(22) PCT Filed: Apr. 2, 2019

(86) PCT No.: PCT/CN2019/080928
§ 371 (c)(1),
(2) Date: May 13, 2019

(87) PCT Pub. No.: WO2020/113873
PCT Pub. Date: Jun. 11, 2020

(65) Prior Publication Data
US 2021/0183840 A1    Jun. 17, 2021

(30) Foreign Application Priority Data
Dec. 3, 2018 (CN) .......................... 201811468452.7

(51) Int. Cl.
| H01L 25/18 | (2006.01) |
| H01L 25/00 | (2006.01) |
| H01L 27/32 | (2006.01) |
| H01L 51/00 | (2006.01) |
| H01L 51/52 | (2006.01) |
| H01L 51/56 | (2006.01) |

(52) U.S. Cl.
CPC .............. *H01L 25/18* (2013.01); *H01L 25/50* (2013.01); *H01L 27/3276* (2013.01); *H01L 51/0097* (2013.01); *H01L 51/5253* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 10,681,806 | B2* | 6/2020 | Huang ................ H05K 1/189 |
| 2014/0217382 | A1 | 8/2014 | Kwon et al. |
| 2014/0299844 | A1* | 10/2014 | You .................... H01L 51/5284 257/40 |
| 2016/0268542 | A1 | 9/2016 | Suzuki |
| 2018/0069192 | A1* | 3/2018 | Ando ................ H01L 51/5246 |
| 2018/0090701 | A1* | 3/2018 | Senda ............... H01L 51/0097 |
| 2018/0197933 | A1* | 7/2018 | Son ................... H01L 27/3248 |
| 2018/0286293 | A1 | 10/2018 | Liu |

(Continued)

FOREIGN PATENT DOCUMENTS

| CN | 106298846 A | 1/2017 |
| CN | 106898264 A | 6/2017 |

(Continued)

*Primary Examiner* — J. E. Schoenholtz

(57) ABSTRACT

A bendable panel and a method of fabricating same are provided. The bendable panel improves a current display panel to provide better support and impact resistance to a bent region of a display panel. In addition, a protection performance, such as corrosion resistance, on a line in the bent region is improved.

9 Claims, 3 Drawing Sheets

(56) References Cited

U.S. PATENT DOCUMENTS

| | | | | |
|---|---|---|---|---|
| 2019/0289712 A1* | 9/2019 | Huang | ................... | H05K 1/118 |
| 2019/0333978 A1* | 10/2019 | Lee | ..................... | H01L 51/0097 |
| 2019/0341566 A1* | 11/2019 | Lee | ..................... | H01L 51/0097 |
| 2020/0119305 A1* | 4/2020 | Kwon | ................. | H01L 51/5253 |
| 2020/0136066 A1* | 4/2020 | Jin | ........................ | H01L 27/323 |

FOREIGN PATENT DOCUMENTS

| | | |
|---|---|---|
| CN | 106973520 A | 7/2017 |
| CN | 108281387 A | 7/2018 |
| JP | H11295747 A | 10/1999 |
| JP | 2016170266 A | 9/2016 |

\* cited by examiner

BENDABLE PANEL AND METHOD OF FABRICATING SAME

FIELD OF INVENTION

The present disclosure relates to the field of flexible display technologies, and more particularly to a bendable panel and a method of fabricating same.

BACKGROUND OF INVENTION

With the development of more advanced manufacturing equipments and material engineering technologies, bendable, foldable, and curved display devices have shown increasingly broad applications. A main advantage of the bendable, foldable, and curved display devices is versatility, which enables product diversity and reaches superior display and appearance.

Active matrix organic light emitting diodes (AMOLEDs) are flexible display technologies with competitive advantages in the future. By mounting flexible display medium electronic components and materials on a flexible or bendable substrate, such that a display has characteristics of being able to be bent or curled into any shape, and has characteristics of being light, thin, and convenient to carry, especially its foldability, such that a panel can have a larger display area without occupying a larger space. The panel can be combined with different shape covers to realize different styles of display products, which helps to increase a market share of the display products.

At present, the more common flexible display application solution is to bend the product at a binding end of the display panel and bend the binding end to a back surface of the display panel to reduce a border area of the display panel and increase a proportion of an active display area of the display panel.

However, when the above flexible display application solution is adopted, the following situation may be encountered. Because a line of the binding end in a bent region is relatively weak, once the flexible display panel is stressed, the line is easily broken.

In view of this, providing a more reliable bendable panel has become an important issue in the industry.

SUMMARY OF INVENTION

An object of the present disclosure is to provide a bendable panel and a method of fabricating same. The bendable panel improves a current display panel to provide better support and impact resistance to a bent region of a display panel. In addition, a protection performance, such as corrosion resistance, on a line in the bent region is improved.

According to an aspect of present disclosure, an embodiment of the present disclosure provides a bendable panel. The bendable panel includes a flexible display panel and a driving chip. The flexible display panel includes a flexible substrate as a base. The flexible substrate includes an active display area and a binding end positioned on a side of the active display area. The driving chip is disposed on the binding end. The binding end is bent toward a direction away from a light emitting side of the flexible display panel, such that the driving chip is positioned on a back surface of the flexible substrate. The binding end includes a first terminal portion adjacent to the active display area, a second terminal portion adjacent to the driving chip, and a bent portion connected to the first terminal portion and the second terminal portion and having a bent shape. A bent region disposed on an inner surface of the bent portion is provided with a glue.

In an embodiment of the present disclosure, the bendable panel further includes a film circuit layer disposed on the flexible substrate and connected between the active display area and the driving chip, and the film circuit layer is attached to the bent portion and bent in a same direction as the bent portion.

In an embodiment of the present disclosure, the bendable panel further includes a conductive line disposed on a surface of the film circuit layer and connected to the flexible display panel and the driving chip.

In an embodiment of the present disclosure, the bendable panel further includes an ultraviolet glue layer disposed on an outer surface of the film circuit layer.

In an embodiment of the present disclosure, the driving chip is directly attached to the flexible substrate.

In an embodiment of the present disclosure, the driving chip is indirectly secured to the flexible substrate by a flip chip.

In an embodiment of the present disclosure, the bendable panel further includes a support plate attached to a back surface of the second terminal portion.

In an embodiment of the present disclosure, the bendable panel further includes a back film layer disposed on the back surface of the flexible substrate, and the back film layer is configured to support and protect the flexible substrate.

According to another aspect of present disclosure, an embodiment of the present disclosure provides a method of fabricating the above bendable panel. The method includes (a) binding the driving chip to the binding end of the flexible substrate, (b) providing the glue on the surface of the binding end facing away from the light emitting side of the flexible substrate, (c) after the glue is applied to the binding end, bending the binding end facing away from the light emitting side of the flexible display panel, such that the driving chip is disposed on the back surface of the flexible substrate, and curing the glue.

In an embodiment of the present disclosure, in step (b), the glue is provided by spraying or coating.

In an embodiment of the present disclosure, in step (d), the glue is cured by high temperature or standing.

Beneficial effects of the embodiment of present disclosure are that, the bendable panel improves a current display panel to provide better support and impact resistance to a bent region of a display panel. In addition, a protection performance, such as corrosion resistance, on a line in the bent region is improved.

DESCRIPTION OF DRAWINGS

The accompanying figures to be used in the description of embodiments of the present disclosure or the prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
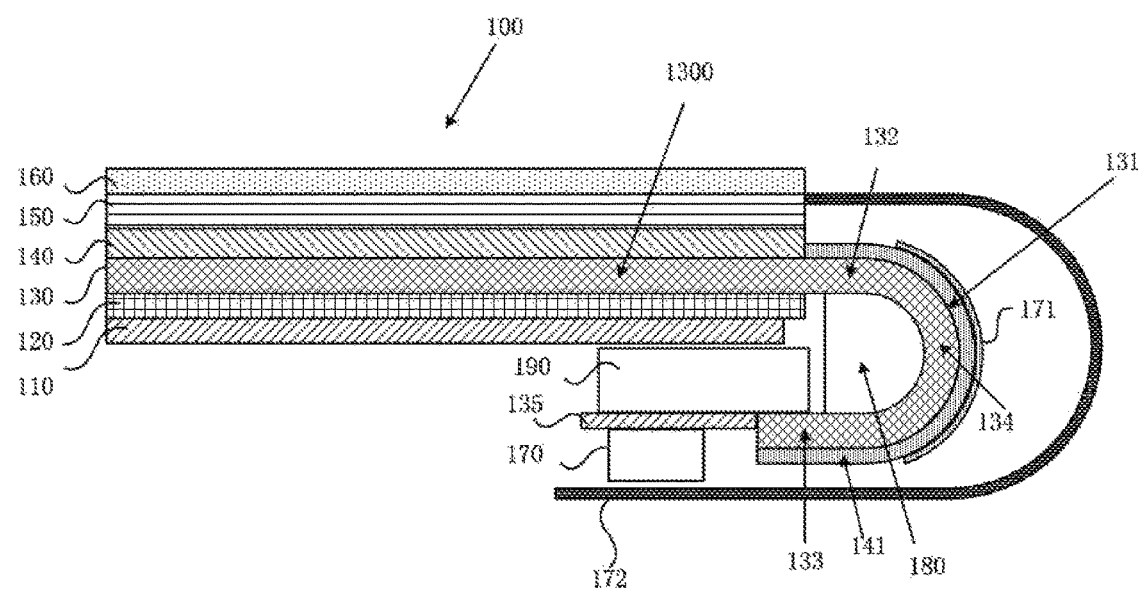
FIG. 1 is a schematic structural diagram of a bendable panel according to an embodiment of the present disclosure.

The technical solutions in the embodiments of the present disclosure will be clearly and completely described in the following with reference to the accompanying drawings. It is apparent that the described embodiments are only a part of the embodiments of the present disclosure, and not all of the embodiments. All other embodiments obtained by those skilled in the art in the art based on the embodiments of the present disclosure without creative efforts are within the scope of the present disclosure.

The terms "first", "second", "third", etc. (if present) in the specification and claims of the present disclosure and the above figures are used to distinguish similar objects and are not necessarily used to describe a particular order or prioritization. It is understood that the objects so described are interchangeable where appropriate. Moreover, the terms "comprising", "having", and "the" and any variants thereof are intended to cover a non-exclusive inclusion.

The drawings, which are discussed below, and the various embodiments used to describe the principles of the present disclosure are intended to be illustrative only and not to limit the scope of the present disclosure. Those skilled in the art will appreciate that the principles of the present disclosure may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present disclosure are intended to describe the specific embodiments and are not intended to illustrate the concept of the present disclosure. Expressions used in the singular encompasses the plural forms of expression unless the context clearly dictates otherwise. In the description of the present disclosure, it is to be understood that the terms "include", "have", "consist of", or variations thereof used in the detailed description are intended to illustrate the possibility of the features, numbers, steps, acts, or combinations thereof disclosed in the description of the present disclosure. It is not intended to exclude the possibility that one or more other features, numbers, steps, acts or combinations may be added. The same reference numerals in the drawings denote the same parts.

Embodiments of the present disclosure provide a bendable panel and a method of fabricating same. The details will be described separately below.

Figure 2:
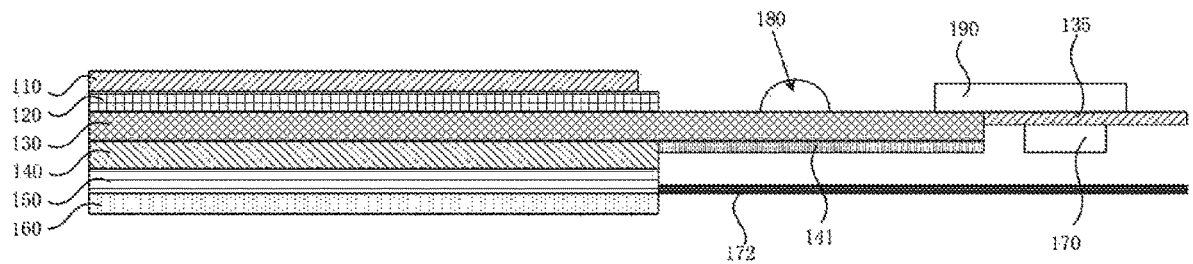
FIG. 2 is a schematic diagram of providing glue before a bending of the bendable panel according to an embodiment of the present disclosure.
Figure 3:
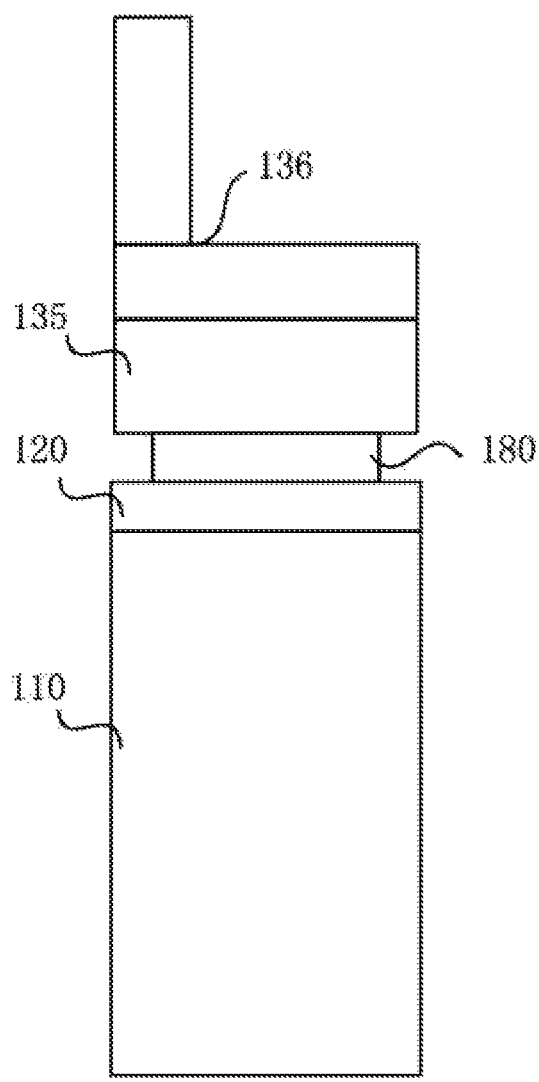
FIG. 3 is another perspective view of providing glue before a bending of the bendable panel according to an embodiment of the present disclosure.

Refer to FIGS. 1 to 3. FIG. 1 is a schematic structural diagram of a bendable panel according to an embodiment of the present disclosure. FIG. 2 is a schematic diagram of providing glue before a bending of the bendable panel according to an embodiment of the present disclosure. FIG. 3 is another perspective view of providing glue before a bending of the bendable panel according to an embodiment of the present disclosure.

The bendable panel of one embodiment of the present disclosure includes a flexible display panel 100 and a driving chip 170.

The flexible display panel 100 includes a flexible substrate 130 as a base. In the embodiment, the flexible substrate 130 is made of a polyimide material, and the flexible substrate 130 has good flexibility because of advantages of wide temperature, chemical resistance, high strength, and the like. It is understood that, in another embodiment of the present disclosure, the flexible substrate 130 may also be a combination of one or more materials such as polyetherimide (PET), polyphenylene sulfide (PPS), and polyarylate (PAR).

The flexible substrate 130 includes an active display area 1300 and a binding end 131 on a side of the active display area 1300. The driving chip 170 is disposed on the binding end 131 of the flexible substrate 130 of the flexible display panel 100 by a bonding process. The binding end 131 is bent toward a direction away from a light emitting side of the flexible display panel 100, such that the driving chip 170 is positioned on a back surface of the flexible substrate 130. In details, the binding end 131 includes a first terminal portion 132 adjacent to the active display area, a second terminal portion 133 adjacent to the driving chip 170, and a bent portion 134 connected to the first terminal portion 132 and the second terminal portion 133 and having a bent shape.

Glue 180 is disposed in a bent region formed by an inner surface of the bent portion 134. In details, the glue 180 may be provided to the inner surface of the bent portion 134 by spraying or coating. The glue 180 can be selected from high temperature curing glue, static setting glue, or other curable gel. A viscosity of the glue 180 can be adjusted, and the glue 180 has a certain fluidity and has a convex shape after coating. When the glue 180 has not been solidified, the binding end 131 is bent. Because the glue 180 has fluidity, the bent region formed by the inner surface of the bent portion 134 is filled with the glue 180. In this way, it is possible to provide better support and impact resistance to the bent region of the flexible display panel 100. After the binding end 131 is bent, the glue 180 is subjected to high temperature or static curing.

In the embodiment, the bent portion 134 of the binding end 131 itself is not provided with a line. On the flexible substrate 130, a film circuit layer 141 is disposed between the active display region 1300 and the driving chip 170, and the film circuit layer 141 is attached to the bent portion 134 and bent in a same direction as the bent portion 134. A conductive line (not shown) for connecting the flexible display panel 100 and the driving chip 170 is disposed on a surface of the film circuit layer 141.

Because the driving chip 170 is finally hidden to the back surface of the flexible substrate 130, a ration of the active display area 1300 of the flexible display panel 100 can be maximized. Electrical connection of the flexible display panel 100 and the driving chip 170 can be achieved by conductive lines in the film circuit layer 141.

In the embodiment, the flexible display panel 100 includes a display module and a touch module disposed on the display module. The display module includes the flexible substrate 130. A thin film transistor layer 140, an organic electroluminescent layer, and a thin film encapsulation layer are sequentially stacked on the flexible substrate 130. The organic electroluminescent layer and the thin film encapsulation layer are not drawn in the structural diagram shown in FIG. The thin film transistor layer 140 may be formed by a low temperature polysilicon (LTPS) or an indium gallium zinc oxide (IGZO) process. The thin film encapsulation layer is used to block moisture attack.

In addition, a back film layer 120 is disposed on the back surface of the flexible substrate 130, and the back film layer 120 is used for supporting and shielding the flexible substrate 130. Optionally, a foam layer 110 may be disposed on the back surface of the back film layer 120 for further protecting the flexible substrate 130.

The touch module includes a touch layer 150, a polarizer layer (not shown), and a cover glass 160. The touch module and the display module are attached to each other by optical glue. The touch layer 150 is used to implement a touch performance. In the embodiment, one end of the touch layer 150 is connected to a flexible printed circuit board 172. The polarizer layer is used to reduce influence of reflection caused by external incident light. The cover glass 160 is used to protect the touch module and the display module. It is understood, in another embodiment, the flexible display panel 100 may also have no touch module and only have a display module.

It can be understood that the film circuit layer 141 is used to bridge a source, a gate driving circuit, and the like of the flexible display panel 100 with an output end of the driving chip 170, thereby avoiding issues that the conductive lines directly plated on the flexible substrate 130 are easily broken. In the embodiment, the driving chip 170 can be indirectly fixed to the flexible substrate 130 by a flip chip 135, and a flexible printed circuit (PFC) 136 is connected to one end of the flip chip 135. It is understood that, in other embodiments, the driving chip 170 can also be directly attached to the flexible substrate 130.

Further, a support plate 190 is attached to the back surface of the second terminal portion 133. The support plate 190 covers at least the back surface of the second terminal portion 133 on which the driving chip 170 is disposed, not only for filling a height difference, but also for ensuring a radius of the binding end 131 after bending. Moreover, strength of a binding position of the driving chip 170 is also enhanced. After the binding end 131 is bent, the support plate 190 is disposed opposite to the flexible substrate 130, the driving chip 170 is hidden on the back surface of the flexible substrate 130, and second terminal portion 133 of the binding end 131 is substantially parallel to the active display area 1300 of the flexible substrate 130.

In the embodiment, an ultraviolet (UV) glue layer 171 is provided on the outer surface of the film circuit layer 141. Because the film circuit layer 141 is attached to the bent portion 134 and bent in the same direction as the bent portion 134, the UV glue layer 171 and the bent portion 134 are bent in the same direction. Therefore, the UV glue layer 171 further enhances a strength of the bent region to avoid issues that the flexible display panel 100 is easily deformed when subjected to an external force such as pressing, thereby better protecting the conductive lines within the circuit wiring layer 141. In addition, in the embodiment, the UV glue layer 171 may be fixed to the film circuit layer 141 by a double-sided tape.

Figure 4:
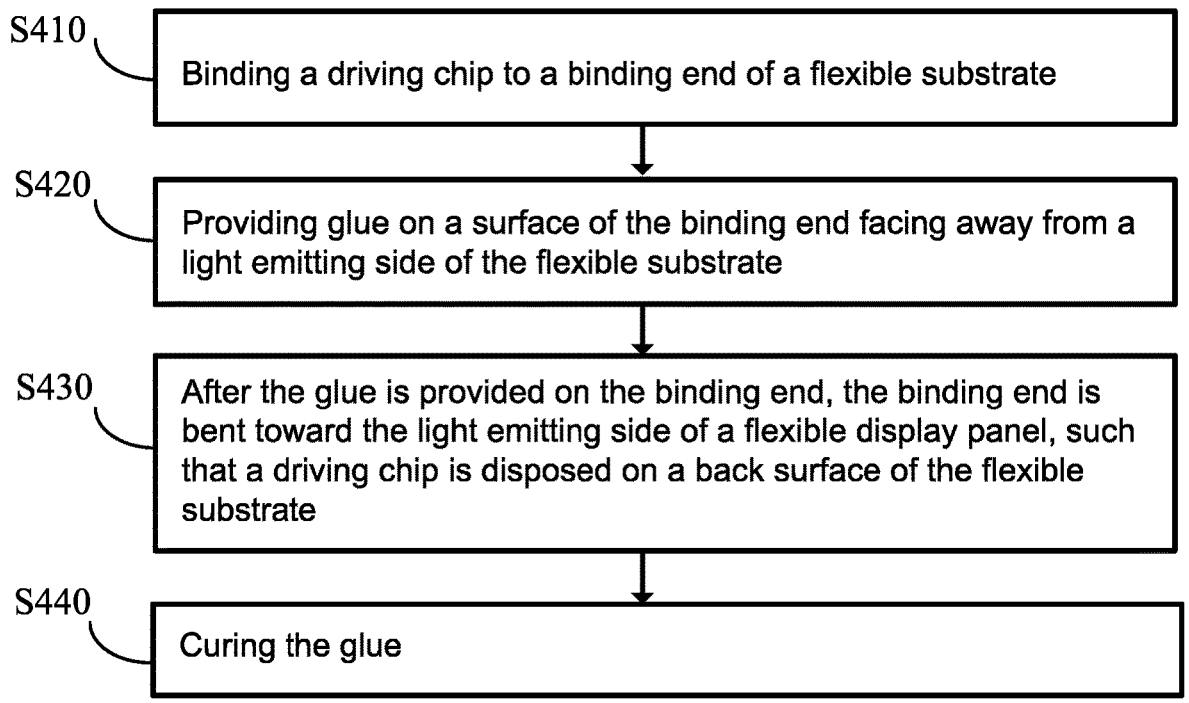
FIG. 4 is a flowchart of a method of fabricating a bendable panel according to an embodiment of the present disclosure.

Referring to FIG. 4, FIG. 4 is a flowchart of a method of fabricating a bendable panel according to an embodiment of the present disclosure.

In an embodiment of the present disclosure, the embodiment of the present disclosure also provides a method of fabricating a bendable panel. The method of fabricating the bendable panel includes the following steps:

Step S410: Binding the driving chip to the binding end of the flexible substrate is provided.

Before the step S410, the thin film transistor layer 140, the organic electroluminescent layer, and the thin film encapsulation layer are formed on the flexible substrate 130 of the flexible display panel 100, and the touch layer 150, the polarizer layer, and the cover glass 160 may be further formed.

In step S410, the driving chip 170 is bonded to the bonding end 131 of the flexible substrate 130. After this step, the method further includes providing the first terminal portion 132 and the second terminal portion 133 on the binding end 131 of the flexible substrate 130, that is, at a position close to the active display area 1300 and a position close to the driving chip 170. The film circuit layer 141 is formed on the flexible substrate 130, and the conductive lines of the film circuit layer 141 are connected to the first terminal portion 132 and the second terminal portion 133, respectively.

Further, a UV glue layer 171 is provided on the outer surface of the film circuit layer 141. Because the film circuit layer 141 is attached to the bent portion 134 and bent in the same direction as the bent portion 134, the UV glue layer 171 and the bent portion 134 are bent in the same direction. Therefore, the UV glue layer 171 further enhances a strength of the bent region to avoid issues that the flexible display panel 100 is easily deformed when subjected to an external force such as pressing.

Step S420: Providing glue on the surface of the binding end facing away from the light emitting side of the flexible substrate is provided.

In the step S420, the glue 180 is provided by spraying or coating. The glue 180 can be a high temperature curing glue, a static setting glue, or other curable glue. A viscosity of the glue can be adjusted, and the glue has a certain fluidity and has a convex shape after coating.

Step S430: After the glue is provided on the binding end, the binding end is bent toward the light emitting side of the flexible display panel 100, such that the driving chip is disposed on the back surface of the flexible substrate.

When the glue 180 has not been solidified, the binding end 131 is bent. Because the glue 180 has fluidity, the bent region formed by the inner surface of the bent portion 134 is filled with the glue 180.

Step S440: Curing the glue is provided.

In this step, the glue 180 is cured by high temperature or standing. Therefore, when the glue 180 is cured, it is possible to provide better support and impact resistance to the bent region of the flexible display panel 100.

The bendable panel of the embodiment of the present disclosure improves the current display panel to provide better support and impact resistance to the bent region of the display panel. In addition, protection of the lines in the bent region, such as corrosion resistance, is enhanced by the provision of the UV layer. In addition, by providing the film circuit layer 141 on the binding end 131 of the flexible substrate 130, an electrical connection between the flexible display panel 100 and the driving chip 170 is realized by the conductive lines in the film circuit layer 141. The binding end 131 is bent away from the light emitting side of the flexible display panel 100 to hide the driving chip 170 on the back of the active display area, such that the ration of the active display area 1300 of the flexible display panel 100 is maximized. The conductive lines are ensured to have good bending property, and foldability of the flexible display panel 100 is improved.

The above description is only a preferred embodiment of the present disclosure, and it should be noted that those skilled in the art can also make several improvements and retouching without departing from the principles of the present disclosure. These improvements and retouching should also be considered as the protection scope of the present disclosure.

The subject matter of the present disclosure can be manufactured and used in the industry with industrial applicability.

What is claimed is:

1. A bendable panel, comprising:
   a flexible display panel comprising a flexible substrate as a base, wherein the flexible substrate comprises an active display area and a binding end positioned on a side of the active display area;
   a driving chip disposed on the binding end, wherein the binding end is bent toward a direction away from a light emitting side of the flexible display panel, such that the driving chip is positioned on a back surface of the flexible substrate;
   a back film layer disposed on the back surface of the flexible substrate, wherein the back film layer is configured to support and protect the flexible substrate;
   a foam layer disposed on the back surface of the back film layer, wherein the foam layer is configured to protect the flexible substrate; and
   a support plate;
   wherein the binding end comprises a first terminal portion adjacent to the active display area, a second terminal portion adjacent to the driving chip, and a bent portion connected to the first terminal portion and the second terminal portion and having a bent shape; and
   wherein a bent region disposed on an inner surface of the bent portion is provided with a glue;
   wherein the support plate is attached to a back surface of the second terminal portion, the support plate covers at least the back surface of the second terminal portion on which the driving chip is disposed, a configuration of the support plate, the back surface of the second terminal portion, and the driving chip fills a height difference between the foam layer and the second terminal portion.

2. The bendable panel according to claim 1, further comprising a film circuit layer disposed on the flexible substrate and connected between the active display area and the driving chip, and the film circuit layer is attached to the bent portion and bent in a same direction as the bent portion.

3. The bendable panel according to claim 2, further comprising a conductive line disposed on a surface of the film circuit layer and connected to the flexible display panel and the driving chip.

4. The bendable panel according to claim 2, further comprising an ultraviolet glue layer disposed on an outer surface of the film circuit layer.

5. The bendable panel according to claim 1, wherein the driving chip is directly attached to the flexible substrate.

6. The bendable panel according to claim 1, wherein the driving chip is indirectly secured to the flexible substrate by a flip chip.

7. A method of fabricating a bendable panel, wherein the bendable panel comprises:
   a flexible display panel comprising a flexible substrate as a base, wherein the flexible substrate comprises an active display area and a binding end positioned on a side of the active display area;
   a driving chip disposed on the binding end, wherein the binding end is bent toward a direction away from a light emitting side of the flexible display panel, such that the driving chip is positioned on a back surface of the flexible substrate;
   a back film layer disposed on the back surface of the flexible substrate, wherein the back film layer is configured to support and protect the flexible substrate;
   a foam layer disposed on the back surface of the back film layer, wherein the foam layer is configured to protect the flexible substrate; and
   a support plate;
   wherein the binding end comprises a first terminal portion adjacent to the active display area, a second terminal portion adjacent to the driving chip, and a bent portion connected to the first terminal portion and the second terminal portion and having a bent shape; and
   wherein a bent region disposed on an inner surface of the bent portion is provided with a glue;
   wherein the support plate is attached to a back surface of the second terminal portion, the support plate covers at least the back surface of the second terminal portion on which the driving chip is disposed, a configuration of the support plate, the back surface of the second terminal portion, and the driving chip fills a height difference between the foam layer and the second terminal portion;
   wherein the method comprises:
   (a) binding the driving chip to the binding end of the flexible substrate;
   (b) providing the glue on the surface of the binding end facing away from the light emitting side of the flexible substrate;
   (c) after the glue is applied to the binding end, bending the binding end facing away from the light emitting side of the flexible display panel, such that the driving chip is disposed on the back surface of the flexible substrate; and
   curing the glue.

8. The method according to claim 7, wherein in step (b), the glue is provided by spraying or coating.

9. The method according to claim 7, wherein in step (d), the glue is cured by high temperature or standing.

* * * * *